(12) United States Patent
May et al.

(10) Patent No.: US 6,521,520 B1
(45) Date of Patent: Feb. 18, 2003

(54) SEMICONDUCTOR WAFER ARRANGEMENT AND METHOD OF PROCESSING A SEMICONDUCTOR WAFER

(75) Inventors: Charles E. May, Gresham, OR (US); Hemanshu Bhatt, Penang (MY)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/943,403

(22) Filed: Aug. 30, 2001

(51) Int. Cl.$^7$ ............................................. H01L 21/4763
(52) U.S. Cl. ........................ 438/595; 438/595; 257/129
(58) Field of Search ........................... 257/211; 438/128, 438/129, 584, 585, 595, 596, 599, 606

(56) References Cited

U.S. PATENT DOCUMENTS

| | | |
|---|---|---|
| 5,930,655 A | 7/1999 | Cooney, III |
| 5,989,998 A | 11/1999 | Sugahara et al. |
| 6,043,145 A | 3/2000 | Suzuki et al. |
| 6,054,379 A | 4/2000 | Yau |
| 6,063,702 A | 5/2000 | Chung |
| 6,215,087 B1 | 4/2001 | Akahori et al. |
| 6,247,998 B1 | 6/2001 | Wiswesser et al. |

*Primary Examiner*—Kamand Cuneo
*Assistant Examiner*—Lisa Kilday
(74) *Attorney, Agent, or Firm*—Maginot, Moore & Bowman, LLP

(57) ABSTRACT

A method of processing a semiconductor wafer and an associated semiconductor wafer arrangement which inhibits "punch through" and increases the yield of functional semiconductor wafers during the fabrication thereof is disclosed. A method of forming a semiconductor with a substrate and a feature on the surface of the substrate is disclosed: Forming a spacer layer that contacts the feature. A barrier layer of silicon nitride can be deposited on the surface. Contacting the barrier layer with the spacer layer, prior to removing the barrier layer. Align a contact void with the barrier layer and spacer layer. Align a contact void such that the etch properties of the barrier layer prevents "punch through".

12 Claims, 4 Drawing Sheets

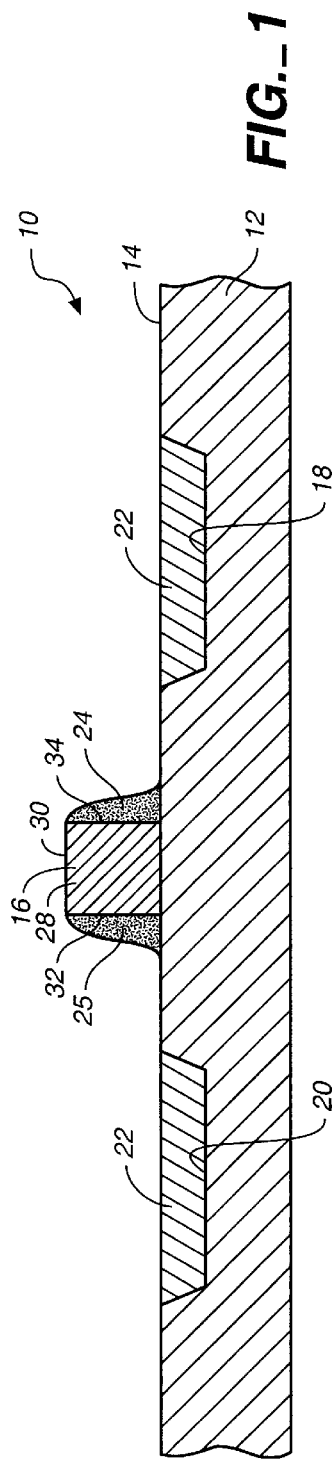
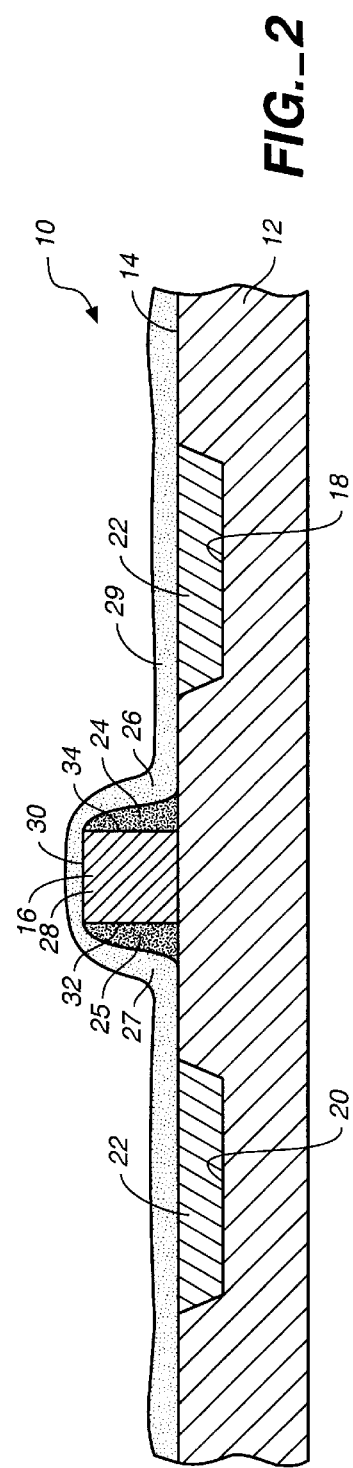
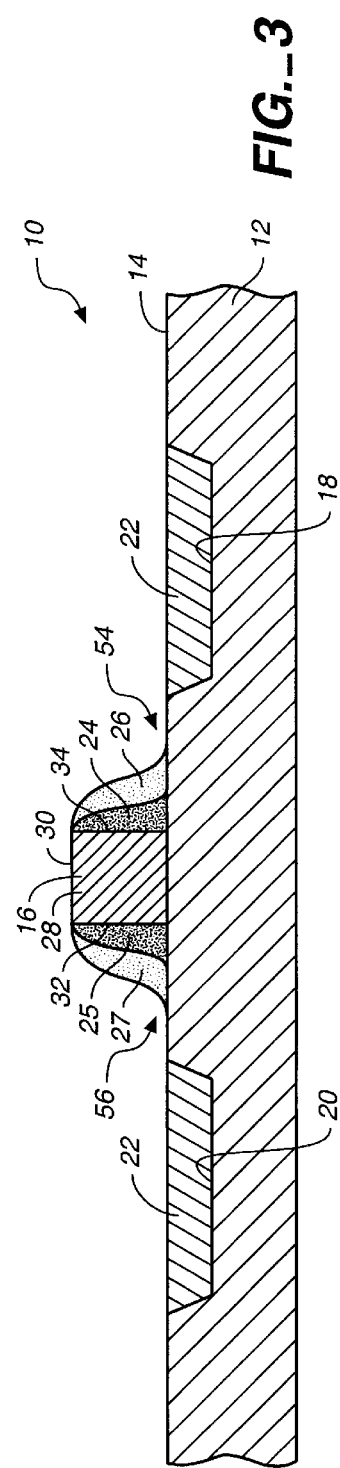

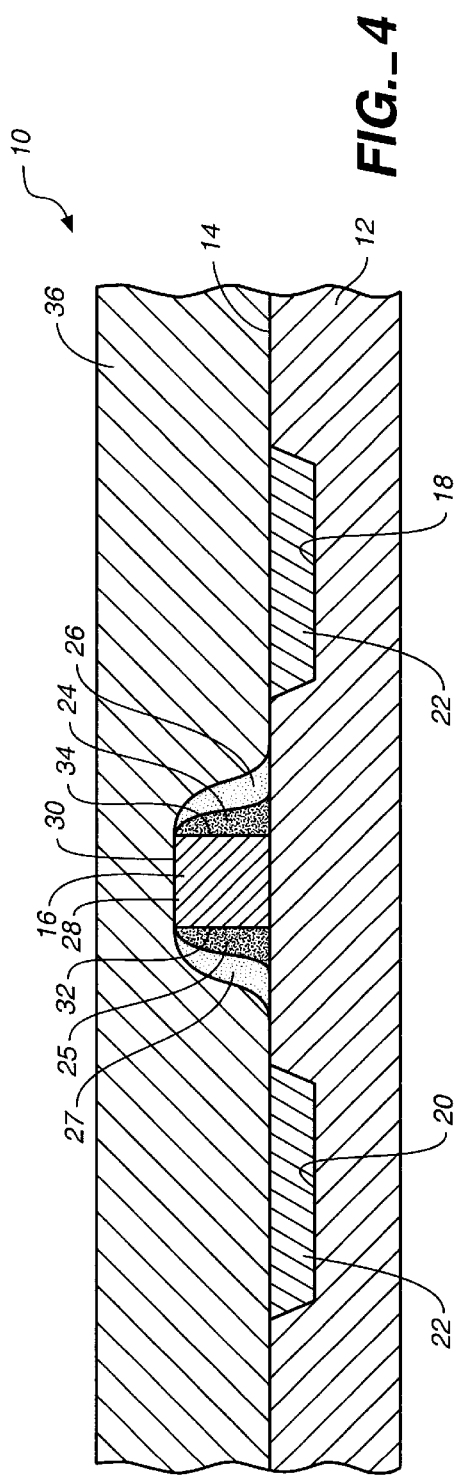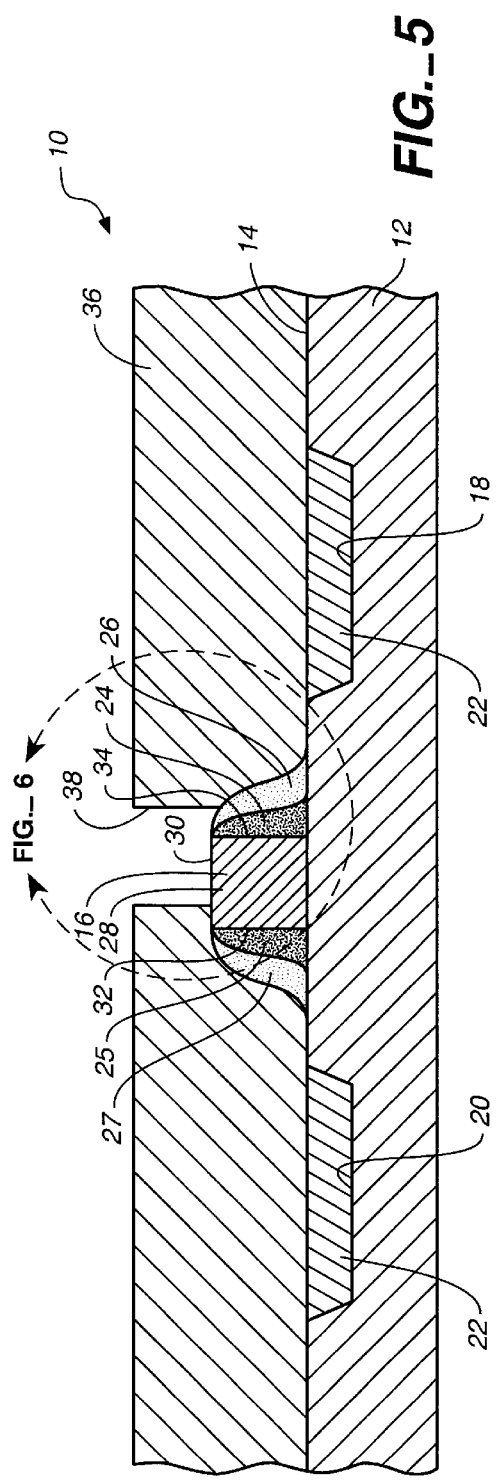

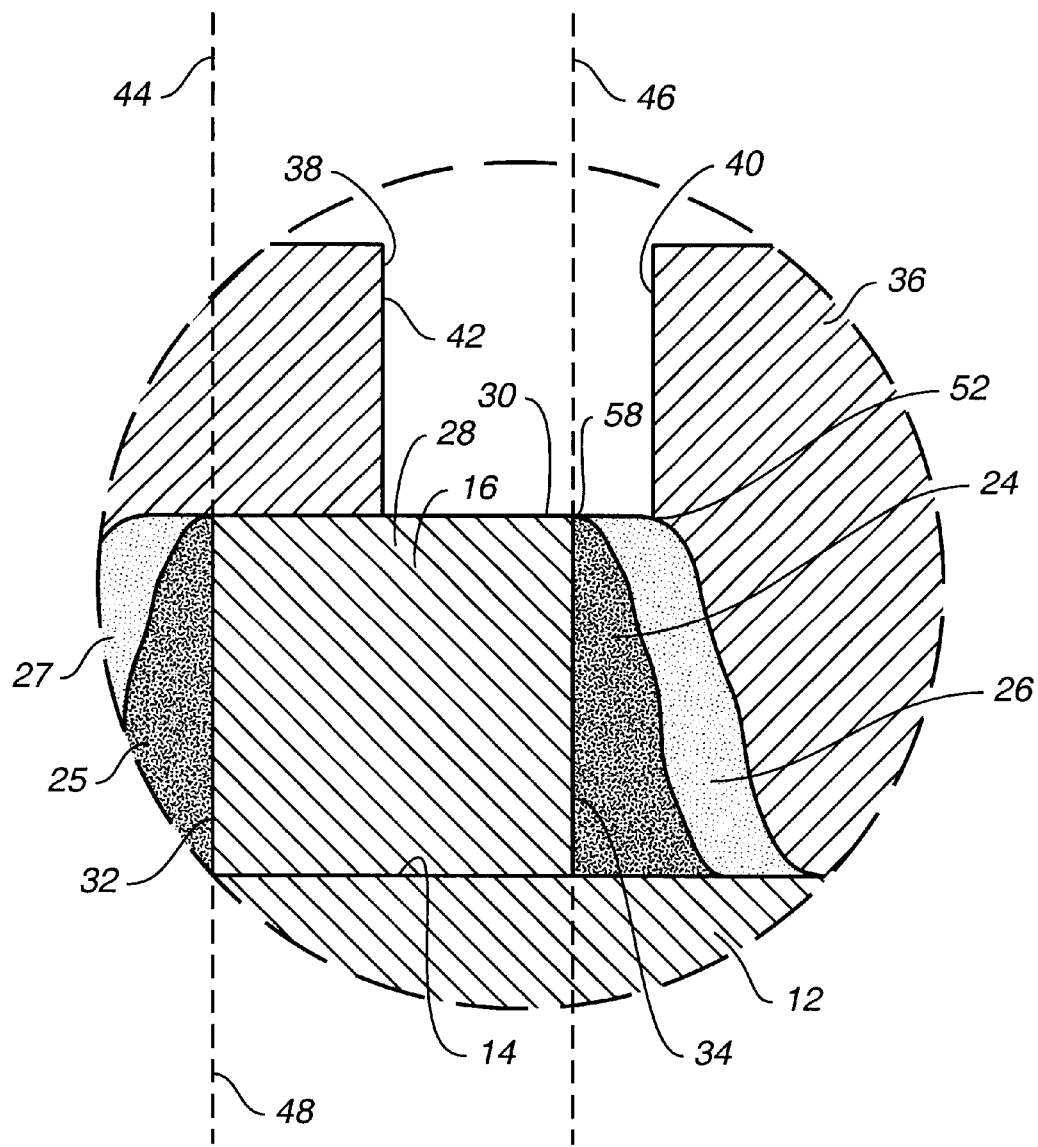
FIG._6

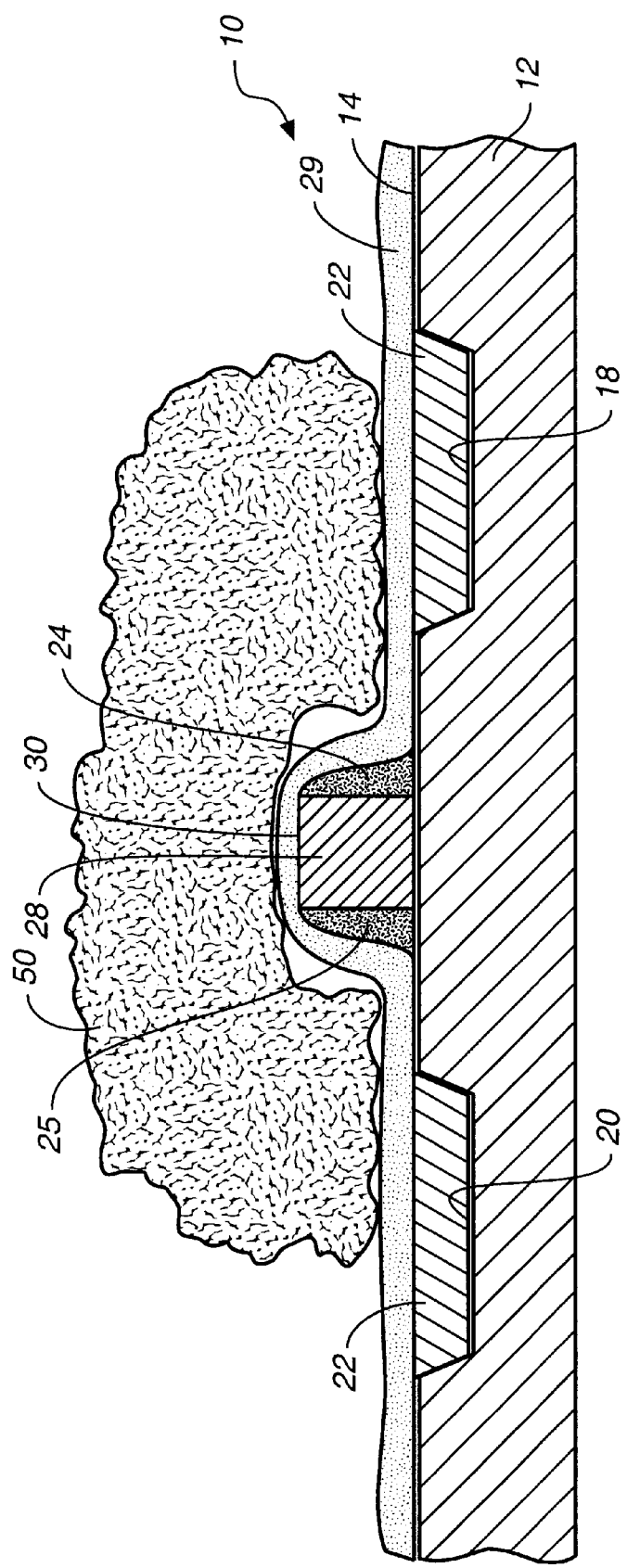
FIG._7

SEMICONDUCTOR WAFER ARRANGEMENT AND METHOD OF PROCESSING A SEMICONDUCTOR WAFER

TECHNICAL FIELD OF THE INVENTION

The present invention relates generally to a semiconductor wafer arrangement and a method of processing a semiconductor wafer, and more particularly to a semiconductor wafer arrangement and a method of processing a semiconductor wafer which inhibits "punch through" and increases the yield of functional semiconductor wafers during the fabrication thereof.

BACKGROUND OF THE INVENTION

Semiconductor wafers are typically fabricated by a layering process in which several layers of material (e.g. a dielectric or an oxide material) are fabricated (i) on a surface of a silicon substrate, or (ii) on a surface of a layer previously disposed on the surface of a silicon substrate. For example, a feature such as a gate can be fabricated on the surface of the silicon substrate. Once the feature is disposed onto the surface of the silicon substrate a layer of an oxide material can also be disposed onto the surface of the substrate material such that the oxide material covers the feature and the surface of the silicon substrate. Once the oxide layer is positioned in the above described manner, the oxide layer is etched so as to form a contact void directly above the feature. In particular, an area of the oxide layer directly over the feature is etched until the etch contacts a top surface of the feature. Since the feature is made from a material which is resistant to the etch (e.g. a dielectric material), the etch stops at the top surface of the feature and thereby creates a contact void through the oxide layer which is located directly above the feature.

However, if the etch area of the oxide layer is not positioned appropriately relative to the feature, for example the etch area is off set relative to the feature rather than being positioned directly over the feature, the etching process can continue past the top surface of the feature and create a defect in the semiconductor wafer commonly known as "punch through". "Punch through" results in the semiconductor wafer being defective. Creating defective semiconductors wafers by allowing the etch to continue past the top surface of the feature in the above described manner decreases the yield of functional semiconductor wafers obtained from the semiconductor wafer fabrication process.

Thus, a continuing need exists for a semiconductor wafer arrangement and a method of processing a semiconductor wafer which inhibits "punch through" and increases the yield of functional semiconductor wafers during the fabrication thereof.

SUMMARY OF THE INVENTION

In accordance with one embodiment of the present invention, there is provided a semiconductor.wafer arrangement. The semiconductor wafer arrangement includes a substrate having a surface. The semiconductor wafer arrangement also includes a feature fabricated from a dielectric material. The feature is attached to the surface such that a first side surface and a second side surface of the feature extend from the surface. The semiconductor wafer arrangement also includes a spacer layer segment positioned in contact with (i) the first side surface of the feature and (ii) the second side surface of the substrate. The semiconductor wafer arrangement further includes a barrier layer segment positioned in contact with (i) the spacer layer segment and (ii) the surface of the substrate so that the spacer layer segment is interposed the first side surface and the barrier layer segment. The semiconductor wafer arrangement further includes an oxide layer positioned in contact with (i) the feature and (ii) the surface of the substrate. The semiconductor wafer arrangement further includes a contact void defined in the oxide layer. The contact void has a first side wall and a second side wall. A space is defined between a first linear extension of the first side surface of the feature and a second linear extension of the second side surface of the feature and the contact void is positioned relative to the feature so that the first side wall of the contact void is located outside of the space.

In accordance with another embodiment of the present invention, there is provided a method of processing a semiconductor wafer which has (i) a substrate, (ii) a surface defined on the substrate, (iii) a feature fabricated from a dielectric material, the feature being attached to the surface such that a first side surface and a second side surface of the feature extend from the surface, (iv) a first spacer layer segment positioned in contact with (A) the first side surface of the feature and (B) the surface of the substrate, (v) a second spacer layer segment positioned in contact with (A) the second side surface of the feature and (B) the surface of the substrate, and (vi) a first isolation trench defined in the surface of the substrate so that the first isolation trench is adjacent to the feature. The method includes (a) disposing a barrier layer onto the surface of the substrate so that the barrier covers the feature and the surface of the substrate and (b) removing the barrier layer from (i) a first area on the surface of the substrate, the first area being interposed the first side surface of the feature and the first isolation trench and (ii) a top surface defined on the feature so as to create a first barrier layer segment positioned in contact with (A) the first spacer layer segment and (B) the surface of the substrate so that the first spacer layer segment is interposed the first side surface of the feature and the first barrier layer segment.

In accordance with still another embodiment of the present invention, there is provided a method of fabricating an electrical device. The method includes (a) providing a semiconductor wafer which has (i) a substrate, (ii) a surface defined on the substrate, (iii) a feature fabricated from a dielectric material, the feature being attached to the surface such that a first side surface and a second side surface of the feature extend from the surface, (iv) a first spacer layer segment positioned in contact with (A) the first side surface of the feature and (B) the surface of the substrate, (v) a second spacer layer segment positioned in contact with (A) the second side surface of the feature and (B) the surface of the substrate, and (vi) a first isolation trench defined in the surface of the substrate so that the first isolation trench is adjacent to the feature, (b) disposing a barrier layer onto the surface of the substrate so that the barrier covers the feature and the surface of the substrate, and (c) removing the barrier layer from (i) a first area on the surface of the substrate, the first area being interposed the first side surface of the feature and the first isolation trench and (ii) a top surface defined on the feature so as to create a first barrier layer segment positioned in contact with (A) the first spacer layer segment and (B) the surface of the substrate so that the first spacer layer segment is interposed the first side surface of the feature and the first barrier layer segment.

It is an object of the present invention to provide a new and useful semiconductor wafer arrangement, method of processing a semiconductor wafer, and method of fabricating an electrical device.

It is an object of the present invention to provide an improved semiconductor wafer arrangement, method of processing a semiconductor wafer, and method of fabricating an electrical device.

It is a further object of the present invention to provide a semiconductor wafer arrangement, a method of processing a semiconductor wafer, and a method of fabricating an electrical device which inhibits "punch through" and increases the yield of functional semiconductor wafers during the fabrication thereof.

The above and other objects, features, and advantages of the present invention will become apparent from the following description and the attached drawings.

BRIEF DESCRIPTION OF THE DRAWINGS

FIG. 1 is a fragmentary cross sectional view of a semiconductor wafer with a feature disposed thereon;

FIG. 2 is a view similar to the one shown in FIG. 1, but showing a barrier layer dispose the semiconductor wafer;

FIG. 3 is a view similar to the one shown in FIG. 2, but showing the barrier layer removed from the active areas of the semiconductor wafer and from a top surface of the feature so as to create a first barrier layer segment and a second barrier layer segment;

FIG. 4 is a view similar to FIG. 3, but showing an oxide layer disposed on the semiconductor wafer;

FIG. 5 is a view similar to FIG. 4, but showing a contact void defined in the oxide layer;

FIG. 6 is an enlarged view of a portion of FIG. 5 which is encircled and indicated as FIG. 6; and FIG. 7 is a view similar to FIG. 2, but showing a fragmentary cross sectional view of a polishing pad positioned in contact with the barrier layer.

DETAILED DESCRIPTION OF A PREFERRED EMBODIMENT

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Referring now to FIG. 1 there is shown a fragmentary cross sectional view of a semiconductor wafer 10. Semiconductor wafer 10 includes a substrate 12, such as silicon, and a surface 14 defined on substrate 12. Semiconductor wafer 10 also includes a feature 28, such as a gate, fabricated from a dielectric material 16. Examples of dielectric materials 16 which can be utilized to fabricate feature 28 include but are not limited to poly silicon, amphorus silicon, and silicon containing from about 1% to about 20% germanium. The feature 28 is attached to the surface 14 such that a side surface 34 and a side surface 32 of the feature 28 extend from the surface 14 of the substrate. The semiconductor wafer 10 further includes a spacer layer segment 24 positioned in contact with (A) the side surface 34 of the feature 28 and (B) the surface 14 of the substrate 12. The semiconductor wafer 10 also includes a spacer layer segment 25 positioned in contact with (A) the side surface 32 of the feature 28 and (B) the surface 14 of the substrate 12. Spacer layer segments 24 and 25 can include a nitride material. Examples of nitride materials which can be utilized to fabricate spacer layer segments 24 and 25 include but are not limited to silicon nitride (plasma deposited, high density plasma deposited, and chemical vapor deposition), tantalum nitride, and hafnium nitride. The semiconductor wafer 10 further includes isolation trenches 18 and 20 defined in the surface 14 of the substrate 12 with each isolation trench 18 and 20 filled with an oxide material 22. Isolation trenches 18 and 20 are positioned adjacent to the feature 28 so that the feature 28 is interposed isolation trenches 18 and 20.

The techniques and methods utilized for fabricating a semiconductor with the above described characteristics, i.e. semiconductor wafer 10, are well known in the art and will not be discussed in detail herein. In particular, the techniques and methods of providing a semiconductor wafer as described above which includes (i) a substrate, (ii) a surface defined on the substrate, (iii) a feature fabricated from a dielectric material, (iv) spacer layer segments, and (v) isolation trenches defined in the surface of the substrate are well known in the art and will not be discussed in detail herein.

Now referring to FIG. 2, a barrier layer 29 is disposed onto surface 14 of substrate 12 so that the barrier layer 29 covers the feature 28 and the surface 14 of the substrate 12. Barrier layer 29 can be disposed onto surface 14 by any well known and appropriate technique. For, example plasma enhanced deposition, chemical vapor deposition, and high density plasma deposition. Barrier layer 29 can include a nitride material. Examples of nitride materials which can be utilized in barrier layer 29 include but are not limited to silicon nitride, tantalum nitride, hafnium nitride, and aluminum nitride. It should be appreciated that the barrier layer 29 is disposed onto surface 14 after the device has already been formed. In other words, the barrier layer 29 is disposed onto surface 14 after the formation of feature 28 and after the formation and filling of the isolation trenches 18 and 20 with an oxide material 22. Disposing barrier layer 29 onto surface 14 after the device has already been formed ensures that the electrical parameters of the semiconductor wafer 10 do not change as result of adding the barrier layer 29.

As shown in FIG. 3, after disposing the barrier layer 29 onto surface 14 of substrate 12 in the above described manner, the barrier layer 29 is removed from an area 54 on the surface 14 of the substrate 12. In particular, area 54 is interposed the side surface 34 of the feature 28 and the isolation trench 18. In addition, the barrier layer 29 is removed from a top surface 30 defined on the feature 28. Removing the barrier layer 29 from area 54 and the top surface 30 creates a barrier layer segment 26 positioned in contact with the spacer layer segment 24 and the surface 14 of the substrate 12 so that the spacer layer segment 24 is interposed the side surface 34 of the feature 28 and the barrier layer segment 26. In addition, the barrier layer 29 is removed from an area 56. In particular, area 56 is interposed the side surface 32 of the feature 28 and the isolation trench 20. Removing the barrier layer 29 from area 56 and the top surface 30 creates a barrier layer segment 27 positioned in contact with the spacer layer segment 25 and the surface 14 of the substrate 12 so that the spacer layer segment 25 is interposed the side surface 32 of the feature 28 and the barrier layer segment 27. Note that, as shown in FIG. 3, the barrier layer 29 is also removed from all active areas of semiconductor wafer 10 such that the only barrier layer 29 left on the surface 14 is barrier layer segment 26 and barrier layer segment 27 and any other barrier layer segments created by removing the barrier layer 29 in the described manner.

As shown in FIG. 7, it is preferable that barrier layer 29 is removed in the above described manner by positioning a polishing pad 50 in contact with the barrier layer 29. In particular, polishing pad 50 is placed in contact with barrier layer 29 and then relative movement is created between the polishing pad 50 and the barrier layer 29 such that the barrier layer 29 is removed in the above described manner. The relative movement between the polishing pad 50 and the barrier layer 29 can be created with any of a number of semiconductor wafer polishing apparatus which are well known and commercially available.

It should be understood that the polishing pad 50 is a soft and thick pad such that when polishing pad 50 is utilized to remove barrier layer 29 the polishing pad 50 does not damage feature 28. As shown in FIG. 7, it should also be appreciated that polishing pad 50 is also soft and flexible enough so that when it is placed in contact with feature 28 it is able to remove barrier layer 29 from (i) top surface 30 of feature 28 and (ii) surface 14 of substrate 12 while being spaced apart from the portions of barrier layer 29 which will eventually become barrier layer segments 26 and 27 (see FIG. 3). Examples of commercially avaliable polishing pads which can be utilized in the present invention include but are not limited to Politex Hi-Nap polishing pad from Rodel Inc., of Newark, Del. and GS polishing pad also from Rodel.

Now referring to FIG. 4, an oxide layer 36 is disposed onto the surface 14 of the substrate 12 and the feature 28. In particular, the oxide layer 36 is placed onto the semiconductor wafer 10 so that the oxide layer 36 covers the surface 14 and the feature 28. Oxide layer 36 can be disposed onto surface 14 by any well known and appropriate technique. For example, oxide layer 36 can be disposed onto surface 14 by high density plasma using either silane or TEOS. In addition, examples of oxide materials which can be utilized in oxide layer 36 include but are not limited to silicon, tantalum, titanium, aluminum, and hafnium.

As shown in FIG. 5, a contact void 38 is defined in the oxide layer 36 adjacent to the feature 28. In particular, the contact void 38 is etched into the oxide layer 36. The contact void 38 can be etched into the oxide layer 36 by any well known and appropriate etching technique. For example, the contact void 38 can be etched into the oxide layer 36 by high density plasma, RIE, and MERIE (magnetically enhanced RIE).

As shown more clearly in FIG. 6, the contact void 38 has a side wall 40 and a side wall 42. Moreover, a space 48 is defined between a linear extension 46 of the side surface 34 of the feature 28 and a linear extension 44 of the side surface 32 of the feature 28. Note that the contact void 38 is positioned relative to the feature 28 so that the side wall 40 of the contact void 38 is located outside of the space 48. In other words the contact void 38 is not aligned, or off set, relative to the feature 28 rather than being positioned directly over the feature 28. In particular, contact void 38 is positioned relative to feature 28 such that an end 52 of the side wall 40 is positioned in contact with the barrier layer segment 26. Note that when contact void 38 is aligned, or not off set from, feature 28 the contact void 38 is positioned directly over the feature 28 such that the side walls 40 and 42 of the contact void 38 are either positioned within the space 48 or are aligned with linear extensions 46 and 44, respectively. However, unlike other semiconductor arrangements which do not have the above described barrier layer segments 26 and 27 formed thereon, the etch utilized to form the contact void 38 is stopped when it comes into contact with the barrier layer segment 26 and the spacer layer segment 24 since the chemical characteristics of the material (e.g. a nitride) utilized to form barrier layer segment 26 and the spacer layer segment 24 are substantially resistant to the etch. Thus the etch stops once it comes into contact with the spacer layer segment 24 and the barrier layer segment 26 rather than continuing past an edge 58 of the feature 28 until it reaches the surface 14 of the substrate 12 thereby causing a "punch through" and thus a defective semiconductor wafer. Therefore, it should be understood that barrier layer segment 26 in cooperation with the spacer layer segment 24 prevents the previously discussed "punch through" and even though the contact void 38 is off set or not appropriately aligned with the feature 28 the semiconductor wafer 10 will still function appropriately. It should also be understood that barrier layer segment 27 functions in the same manner and has the same advantages, i.e. prevents "punch through", as barrier layer segment 26.

Therefore, it should be appreciated that forming the barrier layer 29 and subsequently the barrier layer segments 26 and 27 on semiconductor wafer 10 in the above described manner increases the width or margins of the feature 28, and thus enhances the ability to form the contact void 38 at a location relative to the feature 28 without causing a "punch through". Accordingly, forming the barrier layer segments 26 and 27 on semiconductor wafer 10 in the above described manner inhibits "punch through" and increases the yield of functional semiconductor wafers during the fabrication thereof.

While the invention has been illustrated and described in detail in the drawings and foregoing description, such illustration and description is to be considered as exemplary and not restrictive in character, it being understood that only a preferred embodiment has been shown and described and that all changes and modifications that come within the spirit of the invention are desired to be protected.

What is claimed is:

1. A method of processing a semiconductor wafer which has (i) a substrate, (ii) a surface defined on said substrate, (iii) a feature fabricated from a dielectric material, the feature being attached to the surface such that a first side surface and a second side surface of the feature extend from the surface, (iv) a first spacer layer segment positioned in contact with (A) the first side surface of the feature and (B) the surface of the substrate, (v) a second spacer layer segment positioned in contact with (A) the second side surface of the feature and (B) the surface of the substrate, and (vi) a first isolation trench defined in the surface of the substrate so that the first isolation trench is adjacent to the feature, comprising:

(a) disposing a barrier layer onto the surface of the substrate so that the barrier layer covers the feature and the surface of the substrate; and (b) removing the barrier layer from (i) a first area on the surface of the substrate, the first area being interposed the first side surface of the feature and the first isolation trench and (ii) a top surface defined on the feature so as to create a first barrier layer segment positioned in contact with (A) the first spacer layer segment and (B) the surface of the substrate so that the first spacer layer segment is interposed the first side surface of the feature and the first barrier layer segment.

2. The method of claim 1, wherein:

(b) includes positioning a polishing pad in contact with the barrier layer and removing the barrier layer from (i) the first area and (ii) the top surface with the polishing pad.

3. The method of claim 2, wherein:

the semiconductor wafer also has a second isolation trench defined in the surface of the substrate so that the feature is interposed the first isolation trench and the second isolation trench, and (b) further includes positioning the polishing pad in contact with the barrier layer and removing the barrier layer from a second area with the polishing pad, the second area being interposed the second side surface of the feature and the second isolation trench, so as to create a second barrier layer segment positioned in contact with (A) the second spacer layer segment and (B) the surface of the substrate so that the second spacer layer segment is interposed the second side surface of the feature and the second barrier layer segment.

4. The method of claim 1, further comprising:

(c) disposing an oxide layer onto the surface of the substrate and the feature.

5. The method of claim 4, further comprising:

(d) defining a contact void in the oxide layer, wherein (i) the contact void has a first side wall and a second side wall, (ii) a space is defined between a first linear extension of the first side surface of the feature and a second linear extension of the second side surface of the feature and (iii) the contact void is positioned relative to the feature so that the first side wall of the contact void is located outside of the space.

6. The method of claim 1, wherein:

said first barrier layer segment includes a nitride.

7. The method of claim 6, wherein:

said first spacer layer segment includes a nitride, and said substrate includes silicon.

8. A method of fabricating an electrical device, comprising:

(a) providing a semiconductor wafer which has (i) a substrate, (ii) a surface defined on said substrate, (iii) a feature fabricated from a dielectric material, the feature being attached to the surface such that a first side surface and a second side surface of the feature extend from the surface, (iv) a first spacer layer segment positioned in contact with (A) the first side surface of the feature and (B) the surface of the substrate, (v) a second spacer layer segment positioned in contact with (A) the second side surface of the feature and (B) the surface of the substrate, and (vi) a first isolation trench defined in the surface of the substrate so that the first isolation trench is adjacent to the feature;

(b) disposing a barrier layer onto the surface of the substrate so that the barrier layer covers the feature and the surface of the substrate; and (c) removing the barrier layer from (i) a first area on the surface of the substrate, the first area being interposed the first side surface of the feature and the first isolation trench and (ii) a top surface defined on the feature so as to create a first barrier layer segment positioned in contact with (A) the first spacer layer segment and (B) the surface of the substrate so that the first spacer layer segment is interposed the first side surface of the feature and the first barrier layer segment.

9. The method of claim 8, wherein:

(c) includes positioning a polishing pad in contact with the barrier layer and removing the barrier layer from (i) the first area and (ii) the top surface with the polishing pad.

10. The method of claim 9, wherein:

the semiconductor wafer provided in (a) also has a second isolation trench defined in the surface of the substrate so that the feature is interposed the first isolation trench and the second isolation trench, and (c) further includes positioning the polishing pad in contact with the barrier layer and removing the barrier layer from a second area with the polishing pad, the second area being interposed the second side surface of the feature and the second isolation trench, so as to create a second barrier layer segment positioned in contact with (A) the second spacer layer segment and (B) the surface of the substrate so that the second spacer layer segment is interposed the second side surface of the feature and the second barrier layer segment.

11. The method of claim 10, further comprising:

(d) disposing an oxide layer onto the surface of the substrate and the feature.

12. The method of claim 11, further comprising:

(e) defining a contact void in the oxide layer, wherein (i) the contact void has a first side wall and a second side wall, (ii) a space is defined between a first linear extension of the first side surface of the feature and a second linear extension of the second side surface of the feature and (iii) the contact void is positioned relative to the feature so that the first side wall of the contact void is located outside of the space.

* * * * *